(12) United States Patent
Adelmann

(10) Patent No.: US 7,173,314 B2
(45) Date of Patent: Feb. 6, 2007

(54) STORAGE DEVICE HAVING A PROBE AND A STORAGE CELL WITH MOVEABLE PARTS

(75) Inventor: Todd C. Adelmann, Boise, ID (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 239 days.

(21) Appl. No.: 10/640,063

(22) Filed: Aug. 13, 2003

(65) Prior Publication Data

US 2005/0038950 A1   Feb. 17, 2005

(51) Int. Cl.
  *H01L 29/84* (2006.01)
  *B81B 7/00* (2006.01)
(52) U.S. Cl. ..................................... 257/415
(58) Field of Classification Search ............... 438/52; 257/415, 419
  See application file for complete search history.

(56) References Cited

U.S. PATENT DOCUMENTS

| | | | |
|---|---|---|---|
| 2,981,794 A * | 4/1961 | Cuvelier | 380/27 |
| 5,345,815 A | 9/1994 | Albrecht et al. | |
| 5,835,477 A | 11/1998 | Binnig et al. | |
| 5,856,967 A | 1/1999 | Mamin et al. | |
| 6,233,206 B1 | 5/2001 | Hamann et al. | |
| 6,252,226 B1 * | 6/2001 | Kley | 250/306 |
| 6,370,107 B1 | 4/2002 | Hosaka et al. | |
| 6,473,361 B1 | 10/2002 | Chen et al. | |
| 6,574,130 B2 * | 6/2003 | Segal et al. | 365/129 |
| 6,762,402 B2 | 7/2004 | Choi | |
| 2004/0113641 A1 | 6/2004 | Birecki | |
| 2005/0036428 A1 | 2/2005 | Adelmann | |

OTHER PUBLICATIONS

Adelmann, U.S. Appl. No. 10/619,199, entitled "Storage Device Having A Probe With Plural Tips," filed Jul. 14, 2003, pp. 1-12, Figs. 1-8.
Vettiger and Binnig, Scientific American, "The Nanodrive Project," pp. 47-51, 53 (Jan. 2003).

* cited by examiner

*Primary Examiner*—W. David Coleman

(57) ABSTRACT

A storage device comprises a probe and storage cell having moveable parts that are actuatable to plural positions to represent respective different data states. The probe interacts with the moveable parts to selectively actuate the moveable parts to the plural positions.

30 Claims, 4 Drawing Sheets

STORAGE DEVICE HAVING A PROBE AND A STORAGE CELL WITH MOVEABLE PARTS

BACKGROUND

In computing systems, such as desktop computers, portable computers, personal digital assistants (PDAs), servers, and others, storage devices are used to store data and program instructions. One type of storage device is a disk-based device, such as magnetic disk drives (e.g., floppy disk drives or hard disk drives) and optical disk drives (e.g., CD or DVD drives). Such disk-based storage devices have a rotating storage medium with a relatively large storage capacity. However, disk-based storage devices offer relatively slow read-write speeds and greater space and power consumption when compared to operating speeds of other components of a computing system, such as microprocessors and other semiconductor devices.

Another type of storage device is a solid state memory device, such as a dynamic random access memory (DRAM), static random access memory (SRAM), flash memory, and electrically erasable and programmable read-only memory (EEPROM). Although solid state memory devices offer relatively high read-write speeds, usually on the order of nanoseconds, they have relatively limited storage capacities.

With improvements in nanotechnology (technology involving microscopic moving parts), other types of storage devices are being developed. One such storage device is based on atomic force microscopy (AFM), in which one or more microscopic scanning probes are used to read and write to a storage medium. Typically, a scanning probe has a tip that is contacted to a surface of the storage medium. Storage of data in the storage medium is based on perturbations created by the tip of the probe in the surface of the storage medium. In one implementation, a perturbation is a dent or pit in the storage medium surface. The dent or pit is imprinted by heating a tip of the probe to an elevated temperature and pressing the tip against the storage medium surface.

Yet another type of storage device uses micromechanical storage cells in which each storage cell includes two deflectable cantilevers that are selectively engageable with each other at two different positions to represent different data states. Electrostatic, magnetic, or heating is used to move such deflectable cantilevers to the different positions. The different positions of the cantilevers of a storage cell cause the resistance or capacitance associated with the storage cell to change to indicate respective different data states.

The various types of storage devices discussed above may be associated with one or more of the following issues: low storage capacity, low access speed, relatively expensive manufacturing cost, circuit complexity, reduced reliability associated with having to heat storage elements during circuit operation, and others.

DETAILED DESCRIPTION

Figure 1:
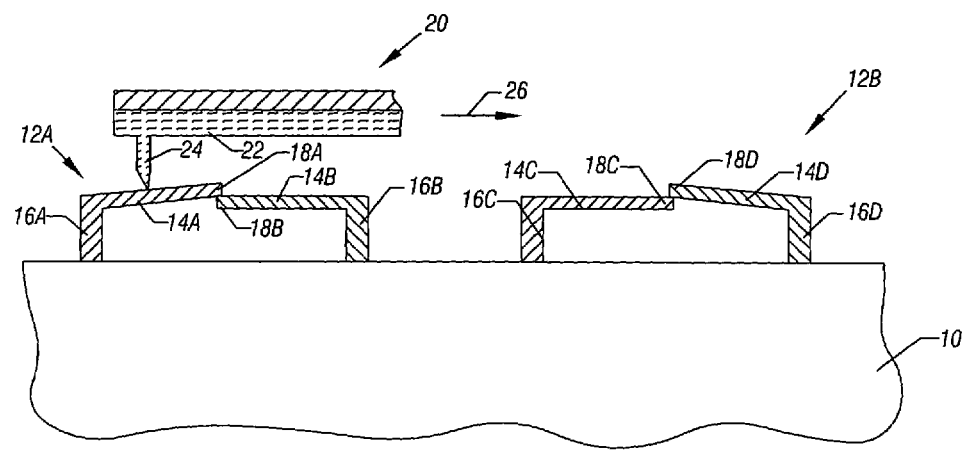
FIGS. 1 and 2 are cross-sectional views of a portion of a probe-based storage device according to one embodiment.

FIG. 1 shows an example probe-based storage device that includes a storage substrate 10 on which are arranged storage cells generally indicated as 12 (12A and 12B illustrated). Each storage cell 12 includes micromechanical structures that are manufactured according to nanotechnology techniques. A "micromechanical storage cell" refers to a storage cell that includes very small structures, with dimensions usually on the order of micrometers, nanometers, or less. The structures of a micromechanical storage cell include moveable parts that are actuatable to different positions to represent different data states.

The micromechanical structures of the storage cells 12 may be formed onto the storage substrate 10. Alternatively, the micromechanical structures may be formed from the material of the storage substrate 10.

In the example implementation shown in FIG. 1, each storage cell 12 includes a pair of deflectable structures. In the storage cell 12A, a first deflectable structure includes a deflectable member 14A that is attached at a first end to a support member 16A. In the illustrated example, the deflectable member 14A is integrally attached to the support member 16A. In a different embodiment, the members 14A and 16A are separate elements that are bonded or otherwise attached together. The second deflectable structure of the storage cell 12A includes a deflectable member 14B having a first end attached to a support member 16B. Each deflectable member 14 can be moved in response to an applied force. The movement can involve one or both of the following: (1) deflecting movement of the deflectable member 14 with respect to the support member 16; and (2) deflecting movement of the support member 16 with respect to the base provided by the storage substrate 10.

The second ends (referred to as "contact ends" 18A, 18B) of respective deflectable members 14A, 14B are engaged to each other, with the contact end 18A of the deflectable member 14A overlapping the contact end 18B of the deflectable member 14B. In a first position, the contact end 18A of the deflectable member 14A sits over the contact end 18B of the deflectable member 14B to represent a first state of a data bit that is stored by the storage cell 12A.

Storage cell 12B stores a data bit that has a second state, which is represented by the deflectable structures of the storage cell 12B being at a second position. The first deflectable structure of the storage cell 12B includes a deflectable member 14C attached to a support member 16C. The second deflectable structure of the storage cell 12B includes a deflectable member 14D attached to a support member 16D. The contact ends 18C and 18D of the deflectable members 14C and 14D, respectively, also overlap, with the contact end 18C located under the contact end 18D. This relative position of the first deflectable member 14C with respect to the second deflectable member 14D corresponds to the second position of the storage cell 12B.

In one implementation, the first state of the data stored in the storage cell 12A corresponds to a logical "0," while the second state of the data stored in the storage cell 12B corresponds to a logical "1." Alternatively, the first state of the storage cell 12A is a logical "1" while the second state of the storage cell 12B is a logical "0."

In other implementations, instead of storage cells each with a pair of deflectable structures, other storage cells can include other types of moveable micromechanical parts. The moveable parts in these other storage cells are also actuatable to different positions to represent different data states.

The substrate 10 can be formed of any type of material that is relatively cost-efficient to produce, such as silicon, polymer, or another material. The support members 16 and deflectable members 14 making up the storage cells 12 can also be formed of any one of number of different types of materials. A desired characteristic of the materials that make up the support members 16 and deflectable members 14 is that the materials be sufficiently strong to withstand repeated deflections of deflectable members 14 and/or the support members 16 without breakage. For example, the members 14 and 16 can be formed of a metal, silicon, polysilicon, and so forth. Alternatively, the various members noted above can be formed from the material of the storage substrate 10.

In accordance with some embodiments of the invention, to write to and read from the storage cells 12, a probe 20 is employed. The probe 20 includes a cantilever 22 and a tip 24 that is attached to and extends outwardly from the cantilever 22. In the arrangement shown in FIG. 1, the probe 20 is provided above the storage cell 12, so that the tip 24 depends from a lower surface of the cantilever 22. In an alternative embodiment, the arrangement of the storage cells 12 to the probe 20 is reversed, such that the tip 24 points upwardly towards the storage cells 12. The cantilever 22 and tip 24 can be formed of any of a number of materials, such as metal, silicon, and others.

Figure 2:
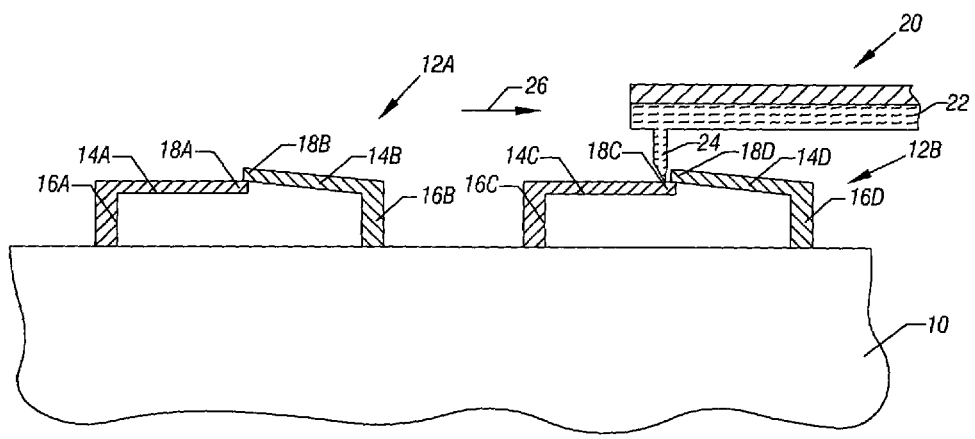

To write data to the storage cell 12A, a downward force is applied by the probe 20 such that the tip 24 presses downwardly on the deflectable member 14A. In response to an applied downward force of greater than a predetermined amount, the deflectable member 14A is pushed underneath the deflectable member 14B, as shown in FIG. 2. This position causes the storage cell 12A to change states, such that a different state of data is represented by the storage cell 12A in FIG. 2. Similarly, to write to the storage cell 12B to change its state, a downward force is applied to the deflectable member 14D to push the deflectable member 14D below the deflectable member 14C. In this manner, the storage cells 12A and 12B are writeable to store either a logical "0" or logical "1."

Once the deflectable members of a storage cell are actuated by the probe tip 24 to a given position, the deflectable members are mechanically latched at that position. The mechanical latching of the deflectable members provides for non-volatile or stable storage of a data bit such that the state of each storage cell can be maintained even though power is removed from the storage device. At a later time, the state of the storage cell can be changed by actuating the deflectable members of the storage cell to a different position.

In the implementation discussed above, actual contact is made between the probe tip 24 and a deflectable member 14 of a storage cell 12 to perform a write. In an alternative embodiment, instead of contact to provide the force necessary to move the deflectable member 14, an electrostatic force can be generated by the probe tip 24 to move the deflectable member 14. In this implementation, the deflectable members 14 are formed of an electrically conductive material such that they can be tied to a reference voltage, such as ground or some elevated voltage. To create electrostatic force, a different voltage is applied to the tip 24 or to some other structure of the probe 20. The difference in voltage between the probe 20 and the deflectable member 14 generates the electrostatic force to move the deflectable member 14.

In alternative embodiments, other techniques can be used to cause movement of the deflectable member 14. For example, the probe 20 can be formed of a magnetic material to generate a magnetic force to move the deflectable members 14. In yet another implementation, the tip 24 of the probe 20 is heatable to an elevated temperature to heat moveable structures in a storage cell 14 to cause movement by thermal expansion and contraction.

To read data, the probe 20 is scanned along a given direction, such as the direction represented by the arrow 26 in FIGS. 1 and 2. In one example, it is assumed that the storage cells 12A and 12B are at the states represented by FIG. 1, and the probe 20 is scanned in direction 26. As the tip 24 is dragged across the upper surfaces of the deflectable members 14A and 14B of the storage cell 12A, the tip 24 will drop relatively abruptly when it transitions from the upper surface of the deflectable member 14A to the upper surface of the deflectable member 14B. This downward transition causes a sudden downward deflection of the cantilever 22 of the probe 20.

As the probe 20 continues to scan along direction 26, it crosses the upper surface of the deflectable member 14C in the storage cell 12B. The probe tip 24 then engages an abrupt upward transition from the upper surface of the deflectable member 14C to the upper surface of the deflectable member 14D. This upward transition causes an abrupt upward deflection of the cantilever 22 of the probe 20. The abrupt deflections are detected by circuitry attached to the probe 20 as well as by remote circuitry of the storage device, as further discussed below.

Figure 3:
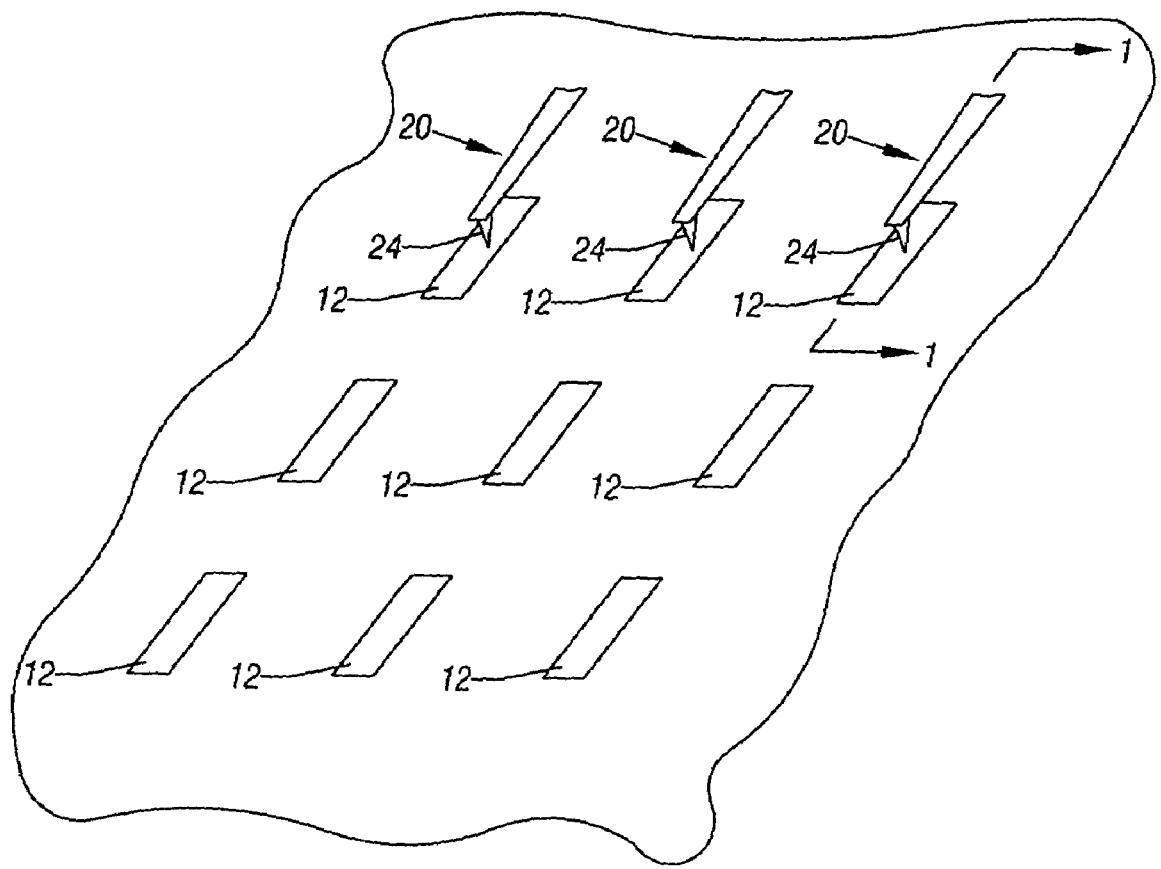
FIG. 3 shows a portion of the probe-based storage device that includes a storage medium containing storage cells, the storage device also including a plurality of probes that are scannable across the storage cells to read and write data.

FIG. 3 shows an array of storage cells 12 and multiple probes 20. In the arrangement of FIG. 3, the multiple probes 20 are capable of concurrently accessing multiple storage cells 12 in a given row of the storage array for improved access speeds. Each probe 20 is also capable of being scanned along a column of storage cells 12 in the array.

Figure 4:
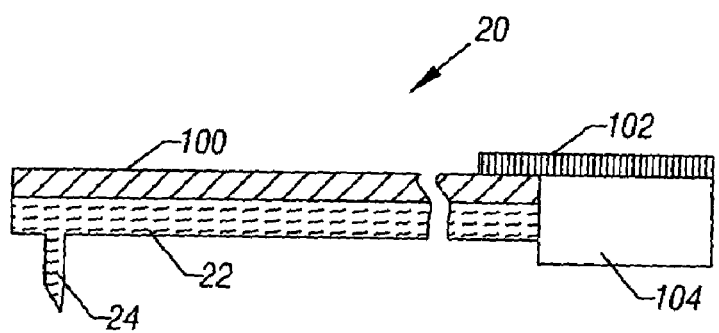
FIG. 4 is a cross-sectional view of a probe, according to one embodiment of the invention.

FIG. 4 is a cross-sectional view of a probe 20 according to one embodiment. The cantilever 22 of the probe 20 is attached to but is deflectable with respect to a base member 104. A piezoresistive element 100 is formed as a layer over the upper surface of the cantilever 22. Piezoresistivity refers to resistance changes of a material when stress is applied to the material. The piezoresistive element 100 is in turn electrically connected to an electrical conductor 102 that extends from the probe 20 to remote detection circuitry for detecting one of two states of data stored in a given storage cell 12. Deflection of the cantilever 22 caused by surface features of the storage cells 12 changes the resistance of the piezoresistive element 100, which is measured by the remote detection circuitry. The downward and upward deflections of the cantilever 22 as the probe tip 24 engages the abrupt transitions between deflectable members of a storage cell causes abrupt changes in the resistance of the piezoresistive element 100 that can be detected to indicate whether a logical "0" or a logical "1" is indicated.

Figure 5:
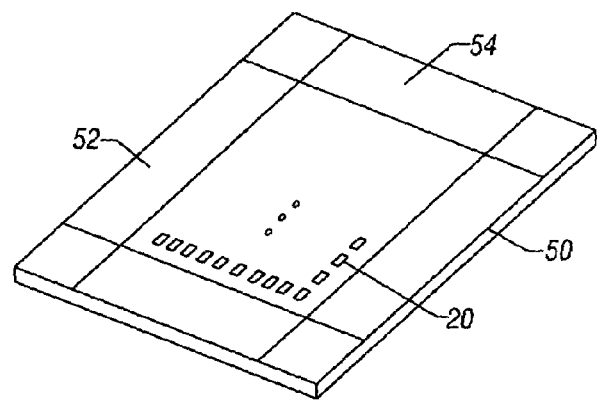
FIG. 5 is a schematic diagram of a probe substrate containing an array of probes and peripheral circuitry to interact with the probes.

FIG. 5 illustrates a probe substrate 50, which includes an array of probes 20 formed in the substrate 50. Peripheral circuitry 52 and 54 are provided on the peripheral sides of the probe substrate 50. For example, peripheral circuitry 52 and 54 can drive X and Y select lines to select bits of the storage array to read from or write to. A row of probes 20 may be activated by the select lines to read from or write to storage cells that the probes are in contact with. Alternatively, a single one of the probes is activated to read from or write to a storage cell. The peripheral circuitry 52 and 54 include sensing devices and decoders to detect analog signals from the probes 20 and to convert the analog signals to the digital representation of a logical "0" or a logical "1." The sensing devices include devices to sense the changes in resistivity of the piezoresistive element 100 (FIG. 4) of each probe 20. The decoders detect how the resistance changes, with resistance change in one direction indicating a first data state (e.g., logical "0"), while resistance change in a different direction representing a second data state (e.g., logical "1").

Figure 6:
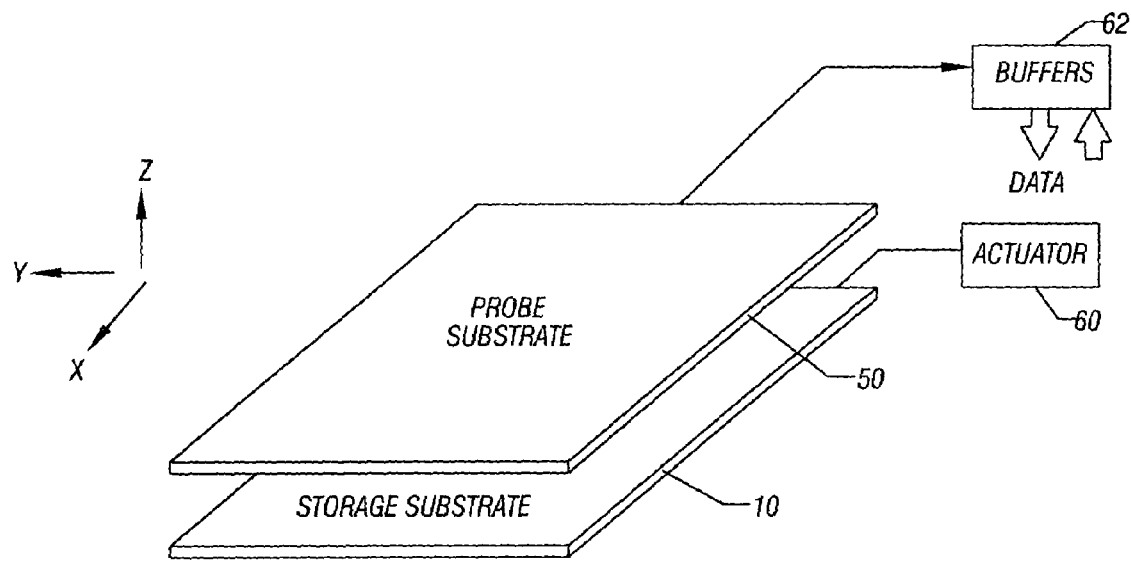
FIG. 6 illustrates a probe substrate positioned to face the storage medium in the probe-based storage device.

As further shown in FIG. 6, the probe substrate 50 is placed over the storage medium with the probe substrate 50 facing the surface of the storage medium on which the storage cells 12 (FIG. 3) are formed. The probe substrate 50 is positioned over the storage substrate 10 so that the probe tips 24 (FIG. 3) point downwardly. In an alternative arrangement, the storage substrate 10 is positioned over the probe substrate 50 so that the probe tips point upwardly. In other arrangements, the probe substrate 50 and the storage substrate 10 can be positioned laterally or diagonally.

The storage substrate 10, in the example of FIG. 6, is coupled to an actuator 60 that is designed to move the storage substrate 10 in both X and Y directions such that the probes 20 can be placed over desired storage cells. Data sensed by the probes 20 is provided to buffers 62, which store output data for retrieval by an external device. The buffers 62 may also contain write data to be written to storage cells in the storage substrate.

Alternatively, the actuator 60 is operatively coupled to move the probe substrate 50, or to move both the probe substrate 50 and the storage substrate 10. The actuator 60 is also able to move the storage substrate 10 and/or the probe substrate 50 in the Z direction, which is generally perpendicular to both the X and Y directions.

Figure 7:
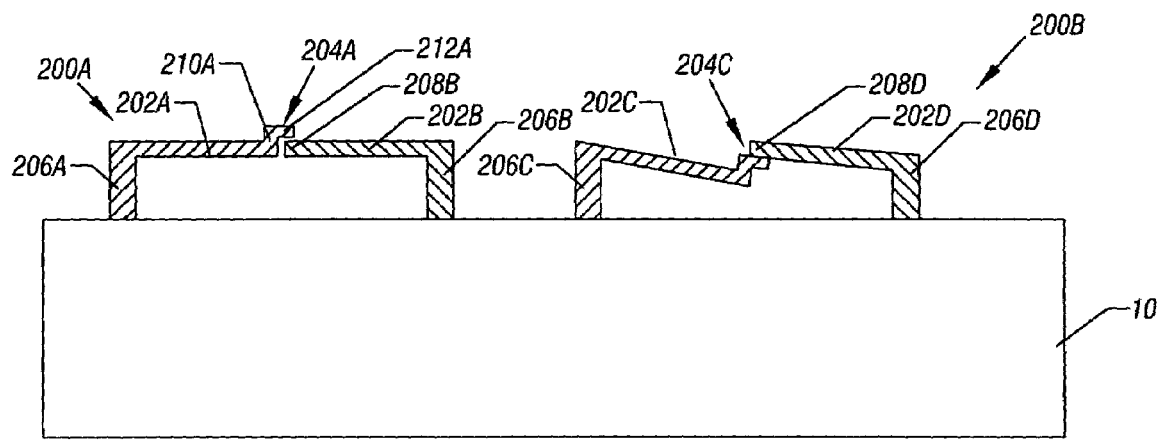
FIG. 7 is a cross-sectional view of a portion of a probe-based storage device according to another embodiment.

FIG. 7 shows a portion of a probe-based storage device according to another embodiment. FIG. 7 shows a storage cell 200A and a storage cell 200B formed on the surface of the storage substrate 10. The storage cell 200A includes a first deflectable structure having a deflectable member 202A that is attached to a support member 206A. The contact end of the deflectable member 202A provides a stepped end portion 204A for engagement to a contact end 208B of a second deflectable member 202B that is attached to a second support member 206B. The stepped end portion 204A has a generally vertical segment 210A and a generally horizontal segment 212A, with the vertical segment 210A connecting the horizontal segment 212A to the deflectable member 202A. Alternatively, instead of the generally right-angled transitions in the end portion 204A, a more curved or slanted configuration can be provided. Effectively, the end portion 204A has a protrusion that is raised and that protrudes outwardly with respect to the deflectable member 202A.

In the storage cell 200A, the contact end 208B of the deflectable member 202B is positioned underneath the stepped end portion 204A of the deflectable member 202A to represent a first data state. The storage cell 200B shown in FIG. 7 stores a second data state. The storage cell 200B includes a first deflectable structure having a deflectable member 202C attached to a support member 206C. The end of the deflectable member 202C provides a stepped end portion 204C. The storage cell 200B includes a second deflectable structure that has a deflectable member 202D attached to support member 206D. The contact end 208D of the deflectable member 202D sits over the stepped end portion 204C of the deflectable member 202C to represent the second data state.

Figure 8:
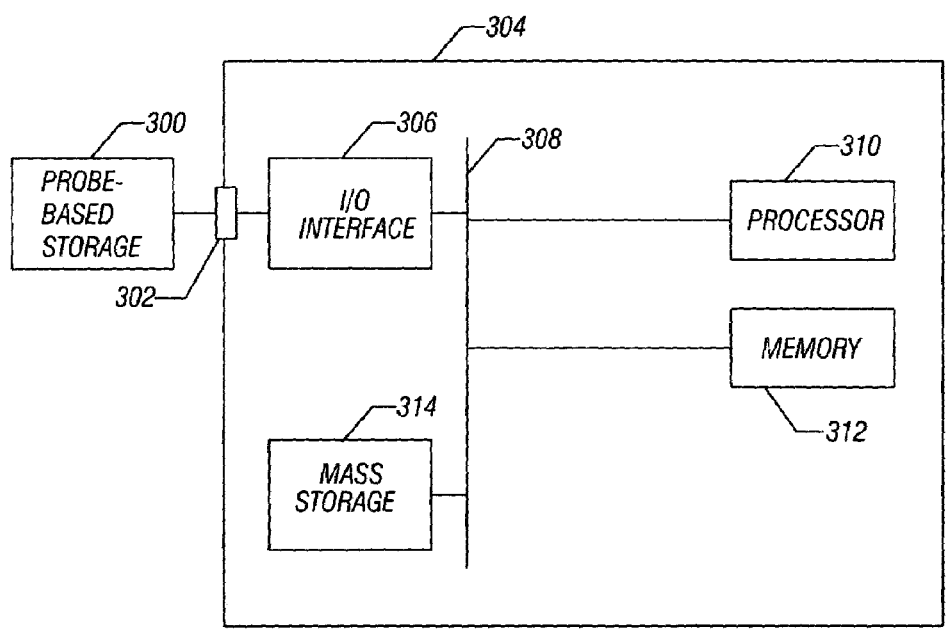
FIG. 8 is a block diagram of a system that includes a computing device having a port to connect to a probe-based storage device.

The probe-based storage device can be packaged for use in computing systems. For example, as shown in FIG. 8, a probe-based storage device 300 as discussed above is attached or connected to an I/O (input/output) port 302 of a computing device 304. The I/O port 302 can be a USB port, a parallel port, or any other type of I/O port. Inside the computing device 304, the I/O port 302 is connected to an I/O interface 306, which in turn is coupled to a bus 308. The bus 308 is coupled to a processor 310 and memory 312, as well as to mass storage 314. Other components may be included in the computing device 304. The arrangement of the computing device 304 is provided as an example, and is not intended to limit the scope of the invention. In another embodiment, instead of being connected to an I/O port of the computing system 304, the probe-based storage device can be mounted onto a main circuit board of the computing device 304.

In the following description, numerous details are set forth to provide an understanding of the present invention. However, it will be understood by those skilled in the art that the present invention may be practiced without these details. While the invention has been disclosed with respect to a number of embodiments, those skilled in the art will appreciate numerous modifications and variations therefrom. It is intended that the appended claims cover such modifications and variations as fall within the true spirit and scope of the invention.

What is claimed is:

1. A storage device comprising:
   a probe; and
   a storage cell having two separate moveable parts actuatable to plural positions to represent respective data states,
   the probe adapted to interact with the moveable parts to selectively actuate the moveable parts to the plural positions.

2. The storage device of claim 1, wherein the moveable parts are mechanically latched at one of the plural positions until actuated to another position by the probe.

3. The storage device of claim 1, wherein the probe has a deflectable cantilever and a tip attached to the cantilever.

4. The storage device of claim 1, wherein the moveable parts comprise deflectable members engageable with each other.

5. The storage device of claim 1, further comprising additional storage cells, each storage cell comprising moveable parts actuatable by the probe to plural positions to represent different data states.

6. The storage device of claim 1, wherein, to write to the storage cell, the probe applies force to actuate the moveable parts to a first position to write a first data state to the storage cell, and to actuate the moveable parts to a second position to write a second data state to the storage cell.

7. The storage device of claim 1, wherein the probe actuates the moveable parts by heating the moveable parts to cause movement by thermal expansion.

8. The storage device of claim 1, further comprising a storage medium on which the storage cell is provided, the storage medium and probe translatable with respect to each other,
   wherein, during a read of the storage cell, the probe is deflected according to a position of the moveable parts to indicate a corresponding data state, and wherein the probe has a piezoresistive element to detect an amount of deflection of the probe.

9. The storage device of claim 2, wherein the storage cell provides non-volatile storage of data.

10. The storage device of claim 3, wherein the tip is adapted to move at least one of the moveable parts.

11. The storage device of claim 4, wherein the storage cell further comprises support members attached to the respective deflectable members, the storage device further comprising a storage medium on which the support members are mounted.

12. The storage device of claim 5, further comprising a storage medium on which the storage cells are mounted, wherein the probe and the storage medium are translatable with respect to each other to enable the probe to engage different storage cells.

13. The storage device of claim 12, further comprising additional probes to enable concurrent access of plural storage cells.

14. The storage device of claim 6, wherein the probe applies the force to change a position of the moveable parts from the first position to the second position.

15. The storage device of claim 6, wherein the probe applies the force by making contact with at least one of the moveable parts.

16. The storage device of claim 6, wherein the probe applies the force by applying an electrostatic force.

17. The storage device of claim 6, wherein the probe applies the force by applying a magnetic force.

18. A system comprising:
a processor, and
a storage device coupled to the processor and comprising:
a probe; and
a storage cell having a first deflectable member and a second deflectable member, the first and second deflectable members engageable at plural positions to represent respective data states,
the probe to selectively deflect the first and second deflectable members to the plural positions.

19. The system of claim 18, wherein the probe has a cantilever and a tip attached to the cantilever,
the tip engageable with at least one of the first and second deflectable members.

20. The system of claim 18, further comprising a plurality of storage cells each comprising first and second deflectable members engageable at plural positions to represent respective data states.

21. The system of claim 18, wherein, to write to the storage cell, the probe applies force to actuate the deflectable members to a first position to write a first data state to the storage cell, and to actuate the deflectable members to a second position to write a second data state to the storage cell.

22. The system of claim 18, wherein the storage device further comprises a storage medium on which the storage cell is provided, the storage medium and probe translatable with respect to each other,
wherein, during a read of the storage cell, the probe is deflected according to a position of the moveable parts to indicate a corresponding data state, and
wherein the probe has a piezoresistive element to detect an amount of deflection of the probe.

23. The system of claim 19, wherein the probe is adapted to apply a force to deflect at least one of the first and second deflectable members.

24. The system of claim 19, wherein the storage cell and probe are movable with respect to each other to detect the position of the first and second deflectable members.

25. The system of claim 23, wherein the probe is adapted to contact at least one of the first and second deflectable members to apply the force.

26. The system of claim 23, wherein the probe is adapted to apply an electrostatic force.

27. The system of claim 23, wherein the probe is adapted to apply a magnetic force.

28. The system of claim 24, wherein the tip is adapted to be scanned across surfaces of the first and second deflectable members, the scanning to cause the cantilever to be deflected in different ways in response to the first and second deflectable members being at respective first and second positions.

29. The storage device of claim 20, further comprising an array of probes to read the storage cells.

30. The system of claim 21, wherein the probe applies the force to change a position of the deflectable members from the first position to the second position.

* * * * *